US008182598B2

(12) United States Patent
Heckmann et al.

(10) Patent No.: US 8,182,598 B2
(45) Date of Patent: May 22, 2012

(54) VIOLET COLORANT FOR COLOUR FILTERS, INKS FOR INK-JET ELECTROPHOTOGRAPHIC TONERS AND DEVELOPERS AND E-INKS

(75) Inventors: Heino Heckmann, Liederbach (DE); Hans-Tobias Macholdt, Darmstadt-Eberstadt (DE); Magali Meder, Kelkheim (DE)

(73) Assignee: Clariant Produkte (Deutschland) GmbH, Frankfurt am Main (DE)

( * ) Notice: Subject to any disclaimer, the term of this patent is extended or adjusted under 35 U.S.C. 154(b) by 828 days.

(21) Appl. No.: 10/591,575

(22) PCT Filed: Feb. 22, 2005

(86) PCT No.: PCT/EP2005/001802
§ 371 (c)(1),
(2), (4) Date: Nov. 29, 2006

(87) PCT Pub. No.: WO2005/085367
PCT Pub. Date: Sep. 15, 2005

(65) Prior Publication Data
US 2007/0186804 A1    Aug. 16, 2007

(30) Foreign Application Priority Data
Mar. 3, 2004   (DE) .................. 10 2004 010 282

(51) Int. Cl.
*G03F 1/00*   (2006.01)
(52) U.S. Cl. .......................... 106/31.6; 430/7
(58) Field of Classification Search ............... 106/31.6; 430/7, 108.21
See application file for complete search history.

(56) References Cited

U.S. PATENT DOCUMENTS

| | | | | |
|---|---|---|---|---|
| 2,297,691 | A * | 10/1942 | Carlson ............................ | 430/55 |
| 4,451,398 | A | 5/1984 | Patsch et al. | |
| 4,986,852 | A | 1/1991 | Dietz et al. | |
| 5,318,627 | A | 6/1994 | Dietz et al. | |
| 5,420,187 | A | 5/1995 | Endo et al. | |
| 5,556,456 | A | 9/1996 | Inoue et al. | |
| 6,284,432 | B1 | 9/2001 | Furubayashi et al. | |
| 6,821,335 | B2 | 11/2004 | Winter et al. | |
| 7,029,818 | B2 | 4/2006 | Rohr et al. | |
| 2002/0098435 | A1 | 7/2002 | Rohr et al. | |
| 2002/0119314 | A1* | 8/2002 | Coffey ............................ | 428/407 |
| 2004/0040471 | A1 | 3/2004 | Winter et al. | |
| 2004/0261662 | A1* | 12/2004 | Grandidier et al. ........... | 106/498 |
| 2010/0101456 | A1 | 4/2010 | Hoyer et al. | |

FOREIGN PATENT DOCUMENTS

| | | |
|---|---|---|
| EP | 0321919 | 6/1989 |
| EP | 0504923 | 9/1992 |
| EP | 0604895 | 7/1994 |
| EP | 0659842 | 6/1995 |
| EP | 1204005 | 5/2002 |
| GB | 2275477 | 8/1994 |
| JP | 1213366 | 8/1989 |
| JP | 1-247468 | 10/1989 |
| JP | 5112732 | 5/1993 |
| JP | 9-137075 | 5/1997 |
| WO | WO 01/04215 | 1/2001 |
| WO | WO 02/34840 | 5/2002 |

OTHER PUBLICATIONS

Diamond, "Handbook of Imaging Mateirals," Marcel Dekker, NY,NY 1991, p. 160-165.*
PCT International Search Report for PCT/EP 2005/001802 mailed Jul. 25, 2005.
English Abstract for JP 09165528, Jun. 24, 1997.
English Translation of International Preliminary Report on Patentability for PCT/EP2005/001802, mailed Feb. 8, 2007.
English abstract of JP 09165528, 1997.
English Translation of Japanese Office Action for Japanese Patent Application No. 2007-501164, mailed Jan. 18, 2011.

* cited by examiner

*Primary Examiner* — Peter Vajda
(74) *Attorney, Agent, or Firm* — Anthony A. Bisulca

(57) ABSTRACT

The invention relates to the use of a pigment preparation comprising
a) a dioxazine compound of the formula (I) as base pigment

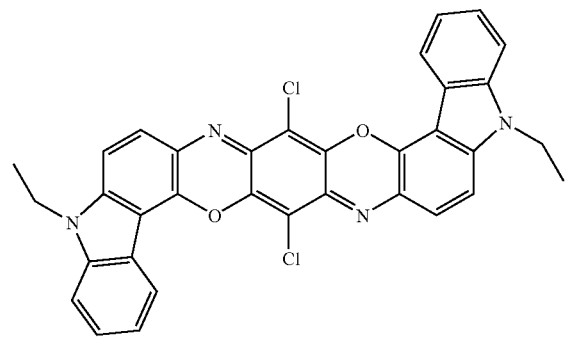

(I)

and
b) a dioxazine compound of the formula (II) as pigment dispersant $$Q\text{-}[Y\text{-}X]_M \quad \quad (II)$$

in which
Q is an m-valent radical of the base pigment of the formula (I),
Y is a bridging moiety,
X is in particular a heterocycle, and
m indicates a numerical value between 1 and 4
as a colorant in color filters, ink-jet inks, electrophotographic toners and developers, and electronic inks.

6 Claims, No Drawings

VIOLET COLORANT FOR COLOUR FILTERS, INKS FOR INK-JET ELECTROPHOTOGRAPHIC TONERS AND DEVELOPERS AND E-INKS

The present invention relates to the use of pigment preparations based on dioxazines (Pigment Violet 23) and pigment-specific dispersants, preferably Pigment Violet 23 substituted by basic groups, in color filters, ink-jet inks, electrophotographic toners and developers and e-inks.

With color filters a full-color image is produced by red, green, and blue image points using transmitted light. As well as the "transmissive" (or "non-emissive") color filters (i.e., those using transmitted light) there are also "reflective" color filters, which are then able to work if appropriate with yellow, cyan, and magenta image points as well.

With color filters a distinction is made between AM (active matrix) and PM (passive matrix) LCD (liquid crystal display) color filters, with the TFT (thin film transistor) LCD color filters being accorded a particular significance.

Color filters are also employed, furthermore, with MEMS (DMD) (micro-electro-mechanical systems, digital micromirror devices), with e-paper, and with further suitable display technologies.

Color filter displays find application in a very wide variety of electrooptical systems, as for example in screens of desktop monitors, in computer screens, screens of portable computers (laptops), PDAs (personal digital assistants), and also in cell phone, video camera, GPS (global positioning system), and other monitors, and also, generally, in liquid crystal and charge-coupled devices, in plasma displays or in electroluminescent and other displays. The last-mentioned displays may be, for example, active (twisted nematic) or passive (supertwisted nematic) ferroelectric displays, or light-emitting diodes, for example.

Color filters find use, moreover, in flat panel displays (flat screens), which are increasingly replacing the conventional cathode ray TV screens, or which may be utilized, generally, as display panels in any desired size for fixed and moving information.

A typical LCD color filter construction may be described schematically as follows: Between two glass plates there is located a thin layer with liquid crystals. Besides a number of other functional components, the upper glass plate has on its outer surface the corresponding image points, e.g., red, green, and blue (R, G, B). These image points are outlined in black for better contrast; to the outside, the R, G, B image points are protected by a suitable protective coat against environmental effects, such as scratches. The lower glass plate also contains further functional components such as, for example, ITO (indium tin oxide) and TFT (thin film transistors), which serve among other things to drive the individual image points.

If suitable light (e.g., linearly polarized light of a defined wavelength) is passed through the lower glass plate, the liquid crystal can then be driven electronically and thereby set to "light" or "dark" (or to any stage in between). Correspondingly, the color filter image points are supplied with light and a corresponding colored image, fixed or moving, based on R, G, B, is produced to the human eye.

With regard to the color filter materials, there are very particular requirements imposed on the colorants employed.

The principal technical parameters which must be met are as follows:

high thermal stability: during the manufacturing operation of a color filter, the individual applied layers are heated, and so the pigment preparation must withstand temperatures up to 300° C. for up to 1 hour;

ready dispersibility in color filter systems;

steep and narrow absorption bands of each applied color filter layer;

high contrast;

high and stable viscosity in the color filter medium: Too high a viscosity prevents the liquid being distributed uniformly on the glass substrate and detracts as a result from the quality of image;

ecotoxicological benignancy in processing;

nonflocculating behavior;

a very smooth (not rough) surface of the applied (pigmented) color filters;

acid resistance (for etching process, for example);

solvent fastness.

WO 01/04215 A2 discloses a process for producing pigments that envisages subjecting a crude pigment, including, preferably P.V. 23, to friction in the presence of relatively large amounts of inorganic salts, with subsequent kneading of the resultant product in the presence of organic liquids. The use of such pigments in color filters is likewise disclosed.

U.S. Pat. No. 6,284,432 B1 describes colorants for color filters that are composed of an organic pigment, an organic pigment derivative containing sulfonate groups and sulfonamide groups, and a binder.

The colorants obtained by these methods are unable, however, to satisfy sufficiently on every occasion the exacting requirements imposed on the colorants by the color filter materials application. Thus, for example, the dispersibility and the flocculation behavior of the colorants, the rheology of pigment preparations produced from them, and the homogeneity and smoothness of layers produced from the preparations are still not sufficient. Moreover, optical parameters, such as the transmittance, steepness of the absorption edges, and the contrast (retention of polarization) are deserving of improvement.

For the violet hue and for the tinting of blue hues, colorants based on C.I. Pigment Violet 23 are of particular interest on account of the color shade.

P.V. 23-based pigments presently on the market, however, have deficiencies in terms of their dispersibility in color filter systems, the flocculation behavior, a high and stable viscosity, the surface quality (e.g., roughness) of the color filter, and the (image) contrast, and consequently can be used either not at all or only with restrictions.

It was an objective of the present invention to provide a colorant with a violet hue for use in color filters, ink-jet inks, electrophotographic toners and developers, and e-inks, which overcomes the deficiencies described above.

This object has been achieved, surprisingly, by a pigment preparation composed of a combination of P.V. 23 and pigment dispersants based on dioxazine compounds which are substituted preferably by basic groups.

The present invention provides for the use of a pigment preparation comprising a) a dioxazine compound of the formula (I) as base pigment

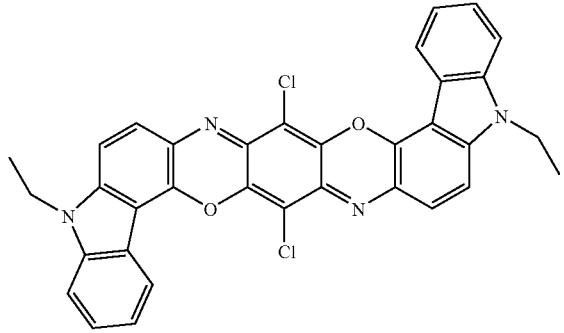

(I)

and b) a dioxazine compound of the formula (II) as pigment dispersant

Q-[Y—X]$_M$ (II)

in which

Q is an m-valent radical of the base pigment of the formula (I),

Y is a bridging moiety from the series —(CR$^1$R$^2$)$_x$— with x being 1 to 6, substituted or unsubstituted phenylene, in particular 1,4-phenylene, —CO—, or —NR$^3$—, or a non-repeating or repeating combination of at least two such bridging members of different type, R$^1$, R$^2$, and R$^3$ independently of one another being hydrogen or C$_1$-C$_4$-alkyl, X is the radical of an aliphatic or aromatic, five-, six- or seven-membered heterocyclic system which is attached to the bridging member Y via a C atom and has in each case 1 to 3 identical or different ring heteroatoms from the series nitrogen, oxygen or sulfur and if desired also has a benzo-fused ring and may be substituted by C$_1$-C$_4$-alkyl, C$_2$-C$_4$-alkenyl, C$_1$-C$_3$-hydroxyalkyl or phenyl;

or is a phthalimido radical which is attached to the bridging member Y via the imide nitrogen and which may be substituted up to a maximum of four times on the benzoid ring by chloro, bromo, nitro, carboxyl, N—(C$_1$-C$_5$-alkyl)carbamoyl, N-phenylcarbamoyl or benzoylamino;

or is a radical —NR$^4$R$^5$, in which R$^4$ and R$^5$ independently of one another are each hydrogen, substituted or unsubstituted C$_1$-C$_{20}$-alkyl or C$_2$-C$_{20}$-alkenyl, C$_5$-C$_6$-cycloalkyl, substituted or unsubstituted phenyl, benzyl or naphthyl;

or in which the group —NR$^4$R$^5$ forms an aliphatic or aromatic, five-, six- or seven-membered heterocyclic system having in each case 1 to 3 identical or different ring heteroatoms from the series nitrogen, oxygen or sulfur, which if desired also has a benzo-fused ring and may be substituted by hydroxyl, oxo, C$_1$-C$_4$-alkyl, C$_2$-C$_4$-alkenyl, C$_1$-C$_3$-hydroxyalkyl or phenyl, and m indicates a numerical value between 1 and 4 as a colorant in color filters, ink-jet inks, electrophotographic toners and developers, and electronic inks.

If m is >1 then the groups (Y—X) can be alike or different; preferably, however, in the case of two or more radicals (Y—X), their definition is in each case identical. By "substituted" phenyl, phenylene or alkyl is meant, preferably, 1 to 5 substituents from the group consisting of hydrogen, Cl, Br, C$_1$-Cl$_8$-alkyl, C$_5$-C$_6$-cycloalkyl, benzyl, C$_6$-C$_{10}$-aryl, pyridyl, pyrryl, thienyl, imidazolyl, oxazolyl, thiazolyl, pyrimidyl, C$_1$-C$_{18}$-alkoxy, C$_6$-C$_{10}$-aryloxy, C$_1$-C$_{18}$-alkylthio, C$_6$-C$_{10}$-arylthio, C$_1$-C18-alkylamino, C$_6$-C$_{10}$-arylamino, di(C$_1$-C$_{18}$-alkyl)amino, C,-C$_{18}$-alkyl-C$_6$-C$_{10}$-arylamino, di(C$_6$-C$_{10}$-aryl)amino, SO$_3$H, C$_1$-C$_{18}$-alkoxysulfonyl, C$_1$-C,$_8$-alkylsulfonyl, and di(C$_1$-C$_{18}$-alkyl) aminosulfonyl.

Preference is given to pigment dispersants of the formula (II) in which

Y has the definition —(CH$_2$)$_p$—, —CO—NR$^3$—(CH$_2$)$_p$—, —CH$_2$—NR$^3$—CO—(CH$_2$)$_p$— or —CH$_2$—NR$^3$—CO—CH$_2$—NH—(CH$_2$)$_n$—, in which R$^3$ is hydrogen or C$_1$-C$_4$-alkyl, and n and p independently of one another are each numerical values from 1 to 6, X is the radical of a furan, thiophene, pyrrole, pyrazole, thiazole, oxazole, triazole, imidazole, thionaphthene, benzoxazole, benzothiazole, benzimidazole, benzotriazole or indole which is attached to the bridging member Y via a C atom;

or is a radical —NR$^4$R$^5$, in which R$^4$ and R$^5$ independently of one another are each hydrogen, unsubstituted or substituted C$_1$-C$_6$-alkyl or C$_2$-C$_6$-alkenyl, C$_5$-C$_6$-cycloalkyl, unsubstituted or substituted phenyl, benzyl or naphthyl;

or in which the group —NR$^4$R$^5$ is a pyrrolinyl, pyrrolidinyl, piperidinyl, morpholinyl, homopiperidinyl or imidazolyl which if desired also has a benzo-fused ring and may be substituted by hydroxyl, oxo, C$_1$-C$_4$-alkyl, C$_1$-C$_3$-hydroxyalkyl or phenyl, and m is a number from 1 to 3.

Particular preference is given to pigment dispersants of the formula (II) in which Y is —(CH$_2$)$_{1-3}$—, —CO—NH—(CH$_2$)$_{1-3}$—, —CH$_2$—NH—CO—(CH$_2$)$_{1-3}$— or —CH$_2$—NH—CO—CH$_2$—NH—(CH$_2$)$_{2-3}$—, X is imidazolyl which is attached to the bridging member Y via the imide nitrogen or the positions 4 or 5, or is a radical —NR$^4$R$^5$, R$^4$ and R$^5$ being hydrogen or C$_1$-C$_4$-alkyl, and m is a number from 1 to 2.5.

Very particular preference for the purposes of the present invention is given to pigment dispersants of the formula (III)

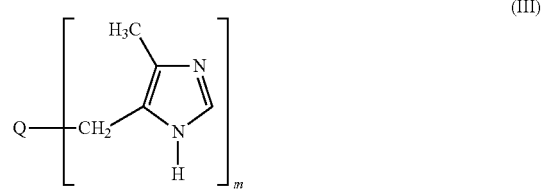

(III)

in which

Q is as defined above and m stands for a numerical value from 1 to 4, preferably 1 to 3, more preferably 1 to 2.5, in particular 1 to 2.

The pigment preparations used in accordance with the invention contain advantageously 0.5% to 99%, preferably 1% to 75%, in particular 2.5% to 50%, and very preferably 5% to 30% by weight of pigment dispersant of the formula (II) or (Ill), based on the weight of the base pigment of the formula (I).

Pigment preparations composed of a dioxazine compound of the formula (I) as base pigment and of a dioxazine compound of the formula (II) as pigment dispersant are already know per se and described for example in EP-A-0 321 919 or EP-A-0 504 923.

An applied photoresist layer is exposed to radiation, for example, then developed, so that only individual image points of the colored layer remain.

This process is then repeated for further colors, so that, finally, R, G, B or Y, M, C image points (pixels) of equal size stand alongside one another.

Table 1 provides a schematic overview of typical color filter systems:

| Application technique | Photoresist dye | Photoresist pigment | Pigmented printing | Pigmented Electrodeposition |
|---|---|---|---|---|
| Binder | Gelatin, casein, acrylates, polyimides | Acrylates, polyimides, polyvinyl alcohol | Epoxy resin, acrylates | Melamines, polyester, epoxy resin |
| Colorant | Dye | Pigment | Pigment | Pigment |
| Film thickness (μm) | 0.7-2.5 | 0.8-2.5 | 1.5-3.5 | 1.5-2.5 |
| Heat stability (° C.) | 180 | 220-300 | 250 | 250 |
| Light stability (h) | <100 | >500 | >500 | >500 |
| Chemical resistance | poor | good | good | good |
| Spectrum | very good | good | good | good |
| Surface | good | good | good | very good |
| Resolution (μm) | 7-20 | 10-20 | 70-100 | 10-20 |

What is new and surprising is that these pigment preparations have performance properties in the stated fields of use that are outstanding in relation to the prior art. By way of example the pigment preparations are notable for ready dispersibility in the application media, stability and high fluidity of the dispersions prepared from them, homogeneity and uniformity of the layers produced by spin coating, for example, and also high transparency and improved contrast of such layers. Moreover, the pigment preparations exhibit high thermal stability, solvent resistance, and chemical resistance.

In addition the colorant can be adapted to the specific requirements of the color filter material by variation in the amount of pigment dispersant of the formula (II).

The color filters can be produced by conventional techniques: The pigment preparation of the invention is dispersed in an aqueous or nonaqueous system, which may contain further components, such as binders, for example. Binders may be thermoplastic, thermosetting or photosensitive.

Examples of thermoplastic and thermosetting binders include acrylates, acrylic esters, polyimides, polyvinyl alcohols, epoxides, polyesters, melamines, gelatins, and caseins. Photosensitive binders are known per se and disclosed for example in U.S. Pat. No. 6,284,432. The color filter paste prepared in this way has a pigment preparation concentration of 2.5% to 80% by weight.

These dispersions (color filter pastes) can then be applied by means of spin coating or suitable, conventional printing techniques (e.g., flexographic, offset, screen, intaglio, and stamp printing) or contactless printing techniques (e.g. ink-jet) to the color filter support material, typically a glass plate.

The image points can also be produced by thermal sublimation, thermal transfer, electrodeposition or other suitable application techniques.

The typical concentration at which the pigment preparations of the invention are employed in the applied color filter film is between 5% and 95%, preferably between 20% and 80%, and very preferably between 40% and 60% by weight, based on the total weight of the color filter film.

The technique most frequently employed is that of spin coating. In this technique the image points, R, G, B for example, are applied in succession in suitable photoresist systems.

For the majority of application techniques such as that of photolithography (photoresist technology), for example, solvents, preferably organic solvents, are a necessary ingredient.

In principle all polar or nonpolar organic solvents are suitable, and depending on the particular application technique are required to possess further properties such as water compatibility or incompatibility, temperature stability, or fulfill safety- and ecotoxicity-related requirements.

Typical solvents are ethylcellosolve acetate, diethylene glycol alkyl ethers (e.g., diethylene glycol monoethyl ether, diethylene glycol dimethyl ether), propylene glycol alkyl ether acetates (e.g., propylene glycol monomethyl ether acetate), ethylene glycol alkyl ether acetates (e.g., ethylene glycol monoethyl ether acetate), N-methylpyrrolidone, ketones (e.g., methyl ethyl ketones, cyclohexanone and cyclopentanone), alcohols, aromatic hydrocarbons, esters (e.g., ethyl 3-ethoxypropionate), and cyclic esters.

These solvents can be used individually or in combination with one another.

The pigment preparations of the invention are also suitable for use as colorants in electrophotographic toners and developers, such as, for example, one- or two-component powder toners (also called one- or two-component developers), magnetic toners, liquid toners, latex toners, polymerization toners, and specialty toners. Toner particles can also be used for cosmetic and pharmaceutical applications, such as for coating tablets.

Typical toner binders are addition-polymerization resins, polyaddition resins, and polycondensation resins, such as styrene resins, styrene acrylate resins, styrene butadiene resins, acrylate resins, polyester resins, phenol-epoxy resins, polysulfones, polyurethanes, individually or in combination, and also polyethylene and polypropylene, which may contain further ingredients, such as charge control agents, waxes, or flow assistants, or may be modified with these adjuvants subsequently.

Electrophotographic toners or developers comprise a typical toner binder and between 0.1% and 80%, preferably between 1% and 40%, and more preferably between 3% and 20% by weight of a pigment preparation of the invention, and between 0% and 20%, preferably between 0.1% and 5% by weight, based in each case on the total weight of the toner or developer, of a charge control agent from the class of triphenylmethanes, ammonium compounds and immonium compounds; fluorinated ammonium and immonium compounds; biscationic acid amides; polymeric ammonium compounds; diallylammonium compounds, aryl sulfide derivatives, phenolic derivatives, phosphonium compounds, and fluorinated phosphonium compounds; calix(n)arenas; cyclodextrins; polyester salts; metal complex compounds; cyclooligosaccharide-boron complexes, interpolyelectrolyte complexes; benzimidazolones; azines, thiazines or oxazines.

In addition it is also possible for electrophotographic toners to contain waxes as well. Furthermore, waxes can also be used as a predispersed concentrate, it being possible for the concentrates (masterbatches) to be multi-component: components are the colorants of the invention, resins, charge control agents, and combinations thereof.

The pigment preparations of the invention exhibit a pronounced neutral and stable inherent triboelectric effect when employed in electrophotographic toners and developers.

The pigment preparations of the invention are suitable for use, moreover, as colorants in ink-jet inks on both an aqueous and a nonaqueous basis, in microemulsion inks, and also in those inks which operate by the hot-melt method. Ink-jet inks generally contain a total of 0.5% to 25%, preferably 1.5% to 8% by weight (calculated on a dry basis) of a pigment preparation of the invention. Microemulsion inks are based on organic solvents, water, and, if desired, an additional hydrotropic substance (interface mediator).

Microemulsion inks generally contain 0.5% to 15% by weight, preferably 1.5% to 8% by weight, of a pigment preparation of the invention, 5% to 99% by weight of water, and 0.5% to 94.5% by weight of organic solvent and/or hydrotropic compound.

"Solvent-based" ink-jet inks contain preferably 0.5% to 15% by weight of the pigment preparation of the invention and 85% to 99.5% by weight of organic solvent and/or hydrotropic compounds.

Hot-melt inks are based mostly on waxes, fatty acids, fatty alcohols or sulfonamides which are solid at room temperature and liquefy on heating, the preferred melting range being situated at between about 60° C. and about 140° C. Hot-melt ink-jet inks are composed, for example, essentially of 20% to 90% by weight of wax and 1% to 10% by weight of a pigment preparation of the invention. Additionally present may be 0% to 20% by weight of an additional polymer (as "dye dissolver"), 0% to 5% by weight of dispersing assistant, 0% to 20% by weight of viscosity modifier, 0% to 20% by weight of plasticizer, 0% to 10% by weight of tack additive, 0% to 10% by weight of transparency stabilizer (which prevents crystallization of the waxes, for example), and 0% to 2% by weight of antioxidant.

In addition the pigment preparations of the invention are also suitable for use as colorants for electronic inks ("e-inks") or electronic paper ("e-paper").

The violet pigment preparations of the invention can be employed individually or in combination with suitable organic or inorganic pigments, or in combination with dyes, and specifically as a mixture in the dispersion (color filter paste). The pigment preparations either serve as shading colorants, which can be added in amounts of 1% by weight to 49% by weight, as in the case of the shading of Pigment Blue 15, for example, or else the pigment preparations are the major components.

Suitable organic pigments include in principle all monoazo, disazo, laked azo, β-naphthol, Naphthol AS, benzimidazolone, disazocondensation, and azo metal complex pigments and polycyclic pigments such as, for example, phthalocyanine, quinacridone, perylene, perinone, thioindigo, anthranthrone, anthraquinone, flavanthrone, indanthrone, isoviolanthrone, pyranthrone, dioxazine, quinophthalone, isoindolinone, isoindoline, and diketopyrrolopyrrole pigments or carbon blacks.

Also suitable in particular are surface-modified pigments whose surface has been modified by chemical operations such as, for example, sulfonation or diazotization and has been provided with functional, neutral or charge-carrying groups or polymer chains (these pigments also being referred to as self-dispersing or graft pigments).

Examples of suitable inorganic pigments include titanium dioxides, zinc sulfides, iron oxides, chromium oxides, ultramarine, nickel or chromium antimony titanium oxides, cobalt oxides, and bismuth vanadates.

Suitable organic dyes include, preferably, solvent-soluble dyes, such as solvent dyes and fatty dyes, but also acid dyes, direct dyes, sulfur dyes and their leucoform, metal complex dyes or reactive dyes; in the case of reactive dyes, dyes which have been reacted with nucleophiles can be used as well.

An exemplary selection of particularly preferred organic pigments includes carbon black pigments, such as gas blacks or furnace blacks, for example; monoazo and disazo pigments, in particular the Colour Index pigments, individually or in combination, such as, for example:

Pigment Red 2, Pigment Red 3, Pigment Red 4, Pigment Red 5, Pigment Red 9, Pigment Red 12, Pigment Red 14, Pigment Red 38, Pigment Red 48:2, Pigment Red 48:3, Pigment Red 48:4, Pigment Red 53:1, Pigment Red 57:1, Pigment Red 112, Pigment Red 122, Pigment Red 144, Pigment Red 146, Pigment Red 147, Pigment Red 149, Pigment Red 168, Pigment Red 169, Pigment Red 170, Pigment Red 175, Pigment Red 176, Pigment Red 177, Pigment Red 179, Pigment Red 181, Pigment Red 184, Pigment Red 185, Pigment Red 187, Pigment Red 188, Pigment Red 207, Pigment Red 208, Pigment Red 209, Pigment Red 210, Pigment Red 214, Pigment Red 242, Pigment Red 247, Pigment Red 253, Pigment Red 254, Pigment Red 256, Pigment Red 257, Pigment Red 262, Pigment Red 263, Pigment Red 266, Pigment Red 269, Pigment Red 274, Pigment Violet 19 or Pigment Violet 32;

Pigment Yellow 1, Pigment Yellow 3, Pigment Yellow 12, Pigment Yellow 13, Pigment Yellow 14, Pigment Yellow 16, Pigment Yellow 17, Pigment Yellow 73, Pigment Yellow 74, Pigment Yellow 81, Pigment Yellow 83, Pigment Yellow 87, Pigment Yellow 97, Pigment Yellow 111, Pigment Yellow 120, Pigment Yellow 126, Pigment Yellow 127, Pigment Yellow 128, Pigment Yellow 139, Pigment Yellow 151, Pigment Yellow 154, Pigment Yellow 155, Pigment Yellow 173, Pigment Yellow 174, Pigment Yellow 175, Pigment Yellow 176, Pigment Yellow 180, Pigment Yellow 181, Pigment Yellow 191, Pigment Yellow 194, Pigment Yellow 196, Pigment Yellow 213, Pigment Yellow 214;

Pigment Orange 5, Pigment Orange 13, Pigment Orange 34, Pigment Orange 36, Pigment Orange 38, Pigment Orange 43, Pigment Orange 62, Pigment Orange 68,. Pigment Orange 70, Pigment Orange 72 or Pigment Orange 74;

Pigment Green 7 or Pigment Green 36 Pigment Blue 15, Pigment Blue 15:1, Pigment Blue 15:2, Pigment Blue 15:3, Pigment Blue 15:4, Pigment Blue 15:6, Pigment Blue 16, Pigment Blue 56, Pigment Blue 60 or Pigment Blue 61.

The pigment preparations of the invention are used with preference for shading green, blue, and red pigments, more preferably with pigments based on P. Blue 15, 15:1, 15:2, 15:3, 15:4, and 15:6.

EXAMPLES:

Production of A Test Color Filter:

First of all a color filter paste is prepared, composed of pigment preparation, binder, solvent, and dispersing assistant, in accordance with the following formula:

87% by weight base varnish (of which 89% is a solvent mixture of 60% 1-methoxy-2-propyl acetate, 30% ethyl 3-ethoxypropionate, 10% cyclohexanone; and 11% is a styrene acrylic polymer);
10% by weight pigment preparation; and
3% by weight Disperbyk® 161.

The above mixture is dispersed with zirconium beads (00.5-0.7 mm) in a paint shaker for 3 hours. The color filter paste is then filtered and diluted with the solvent mixture present in the base varnish, until the fraction of the pigment preparation in the paste is 6% by weight.

The diluted color filter paste is applied using a spin coater to a glass substrate to produce a color filter film. The spin coater speed which is set determines the thickness of the color filter film (the faster the spin coater, the thinner the film), which in turn has an influence on the transparency (the thicker the film, the greater its absorption). The film thickness is usually below 1 µm. The transparency and the contrast are determined on this color filter film.

The transmittance of the coated glass substrate is determined spectrophotometrically in the application range of 400-700 nm. Transmittance values are detected at 31 wavelengths. The coloristic qualities are described using the CIE L*a*b* color model. In this model L* describes the luminance, with the numerical value 0 standing for black and 100 for white. a* describes the red-green axis, b* the blue-yellow axis.

The dispersibility of the pigment preparation of the invention is ascertained by means of viscosity measurement. The viscosity is determined on the diluted color filter paste described above. The measurement is made using a rotational viscometer (type RS75, from Haake) at a temperature of 23° C. ±0.5° C. and at a shear rate of 60 s$^{-1}$.

Example of the Synthesis of a Pigment Dispersant 60 parts of crude Pigment Violet 23 (salt-free) are introduced at 120° C. into 1500 parts of polyphosphoric acid. An hour of stirring is followed by slow addition of 28.7 parts of 4-methyl-5-hydroxymethylimidazole hydrochloride. The reaction mixture is stirred at 120° C. for 5 hours. It is then discharged onto ice-water, adjusted to a pH of 10 using concentrated aqueous sodium hydroxide solution, and left to stand overnight. Subsequently the precipitate is isolated by suction filtration, washed with water until neutral and salt-free, and dried at 50° C. This gives 73 parts of the pigment dispersant of the formula (III) with m being 1.

Example 1 a) Synthesis of Pigment Crude 30 parts of coarsely crystalline crude pigment (Pigment Violet 23), prepared in salt-free form in accordance with BIOS Final Report 960, page 75, are introduced into a cylindrical 1-liter plastic container which is filled with 1400 g of Cylpebs (made of corundum, 12 mm in diameter, manufacturer: Groβ GmbH, Hof) as grinding media. The mixture is then finely ground for 4 hours with shaking on a vibratory mill of the Vibratom® type (manufacturer: Siebtechnik Muhlheim). Thereafter the millbase is sieved to remove the grinding media. This gives 29 g of millbase.

b) Finishing 29 parts of crude pigment P.V. 23 millbase are added to 103.0 parts of water and 37.2 parts of isobutanol. After this system has been stirred for a number of hours at boiling temperature, 23.7 parts of a 10% by weight aqueous suspension of the pigment dispersant of the formula (III) with m being 1, prepared as described in the synthesis example above, are added, the solvent is removed by distillation, and the batch is diluted with 18.7 parts of water.

c) Working Up

Subsequently the batch is subjected to hot suction filtration. The product is washed salt-free and dried under reduced pressure at 80° C.

d) Milling

The resulting 31.0 parts of the pigment preparation are milled on a pinned disc mill. This gives a highly crystalline powder having an X-ray index of 7.31 and a BET surface area of 93.2 m$^2$/g.

Investigation of the particle size distribution of the primary particles yields the following parameters:
$d_{25}$=37 nm, $d_{50}$=47 nm, $d_{75}$=60 nm.
Length to width ratio: 1.45:1

Determination of Transmittance and Coloristic Properties:

A color filter paste is prepared as described above. The viscosity of the color filter paste is as follows: η=13.6 mPa·s.

Subsequently 3 ml of the diluted color filter paste are pipetted and applied to a glass substrate using a spin coater at a rotary speed of 2500 rpm for 20 s. The coloristic properties of the color filter film are subsequently determined spectrophotometrically.

Coloristics:

| L* | a* | b* |
|---|---|---|
| 49.88 | 47.83 | −60.12 |

Transmittance Values of the Color Filter Film:

| | Wavelength | | | | | | |
|---|---|---|---|---|---|---|---|
| | 400 nm | 410 nm | 420 nm | 430 nm | 440 nm | 450 nm | 460 nm |
| Transmittance (%) | 64.2 | 67.6 | 70.4 | 72.4 | 73.1 | 71.6 | 68.2 |

| | Wavelength | | | | | |
|---|---|---|---|---|---|---|
| | 470 nm | 480 nm | 490 nm | 500 nm | 510 nm | 520 nm |
| Transmittance (%) | 62.6 | 53.2 | 39.3 | 25.7 | 15.4 | 8.3 |

-continued

|                  | Wavelength |        |        |        |        |        |
|------------------|------------|--------|--------|--------|--------|--------|
|                  | 530 nm     | 540 nm | 550 nm | 560 nm | 570 nm | 580 nm |
| Transmittance (%)| 5.3        | 5.2    | 5.7    | 5.6    | 6.6    | 11.1   |

|                  | Wavelength |        |        |        |        |        |
|------------------|------------|--------|--------|--------|--------|--------|
|                  | 590 nm     | 600 nm | 610 nm | 620 nm | 630 nm | 640 nm |
| Transmittance (%)| 19.8       | 28.1   | 29.7   | 26.1   | 26.4   | 34.8   |

|                  | Wavelength |        |        |        |        |        |
|------------------|------------|--------|--------|--------|--------|--------|
|                  | 650 nm     | 660 nm | 670 nm | 680 nm | 690 nm | 700 nm |
| Transmittance (%)| 48.8       | 62.7   | 72.6   | 78.5   | 81.8   | 83.7   |

Determination of Particle Size Distribution:

A disc centrifuge is used to determine the particle size distribution of the dilute color filter paste. To allow the measurement to be carried out, a density gradient is produced. It consists of the ingredients of the base varnish used for preparing color filter pastes.

| Maximum peak | Value at half peak height | $d_{50}$ |
|--------------|---------------------------|----------|
| 67.6 nm      | 52.9 nm                   | 68.9 nm  |

Electrostatic Properties (Toner):

5 parts of the pigment preparation are incorporated homogeneously using a kneading device into 95 parts of a toner binder (styrene-acrylate copolymer 60:40, Dialec® S309, Diamond Shamrock) over the course of 30 minutes. The resulting system is milled on a universal laboratory mill and then classified on a centrifugal classifier. The desired fraction (4 to 25 μm) is activated with a carrier composed of magnetite particles coated with styrene-methacrylic copolymer (90:10).

The measurement is made on a conventional q/m measurement system. A sieve with a mesh size of 25 μm is used to ensure that no carrier is entrained in the course of the toner blowouts. The measurements are made under a relative atmospheric humidity of approximately 50%. As a function of the activation time the following q/m values (μC/g) are measured:

| Activation time | Charge q/m    |
|-----------------|---------------|
| 5 min           | +2.3 μC/g     |
| 10 min          | +2.2 μC/g     |
| 30 min          | +2.3 μC/g     |
| 120 min         | +2.2 μC/g     |

Example 2 a) Pigment Crude
The preparation takes place as in Example 1 a).

b) Finishing
The preparation takes place as in Example 1 b), but adding 27.4 parts of a 10% by weight aqueous suspension of the pigment dispersant of the formula (III) with m being 1.

c) Working up and d) milling take place as in Example 1.

This gives a highly crystalline powder having an X-ray index of 7.11 and a BET surface area of 93.7 m²/g.

The investigation of the particle size distribution of primary particles yields the following parameters:

$d_{25}$=50 nm, $d_{50}$=78 nm, $d_{75}$=203 nm.

Length to width ratio: 1.67:1

The Transmittance is Determined in the Same Way As in Example 1.

Colonistics:

| L*    | a*    | b*     |
|-------|-------|--------|
| 46.01 | 52.58 | −64.19 |

Transmittance Values of the Color Filter Film:

|                  | Wavelength |        |        |        |        |        |        |
|------------------|------------|--------|--------|--------|--------|--------|--------|
|                  | 400 nm     | 410 nm | 420 nm | 430 nm | 440 nm | 450 nm | 460 nm |
| Transmittance (%)| 61.2       | 65.2   | 68.3   | 70.4   | 71.0   | 69.1   | 65.2   |

|                  | Wavelength |        |        |        |        |        |
|------------------|------------|--------|--------|--------|--------|--------|
|                  | 470 nm     | 480 nm | 490 nm | 500 nm | 510 nm | 520 nm |
| Transmittance (%)| 58.8       | 48.5   | 34.0   | 20.6   | 11.3   | 5.5    |

-continued

|  | Wavelength | | | | | |
| --- | --- | --- | --- | --- | --- | --- |
|  | 530 nm | 540 nm | 550 nm | 560 nm | 570 nm | 580 nm |
| Transmittance (%) | 3.2 | 3.1 | 3.6 | 3.5 | 4.5 | 8.5 |

|  | Wavelength | | | | | |
| --- | --- | --- | --- | --- | --- | --- |
|  | 590 nm | 600 nm | 610 nm | 620 nm | 630 nm | 640 nm |
| Transmittance (%) | 16.5 | 24.1 | 25.3 | 21.8 | 22.3 | 31.0 |

|  | Wavelength | | | | | |
| --- | --- | --- | --- | --- | --- | --- |
|  | 650 nm | 660 nm | 670 nm | 680 nm | 690 nm | 700 nm |
| Transmittance (%) | 45.7 | 61.1 | 72.9 | 80.3 | 84.6 | 87.0 |

Determination of Viscosity:

The color filter paste from Example 2 is subjected to measurement as in Example 1.
The Viscosity is as Follows: η=22.8 mPas.

Determination of Particle Size Distribution:

The color filter paste from Example 2 is subjected to measurement as in Example 1.

| Maximum peak | Value at half peak height | $d_{50}$ |
| --- | --- | --- |
| 70.6 nm | 53.3 nm | 71.2 nm |

Electrostatic Properties (Toner):

A test toner is prepared and subjected to measurement as in Example 1, incorporating now 5 parts of pigment preparation from Example 2 rather than 5 parts of the pigment preparation from Example 1. As a function of the activation time the following q/m values are measured:

| Activation time | Charge q/m |
| --- | --- |
| 5 min | +3.1 µC/g |
| 10 min | +2.9 µC/g |
| 30 min | +2.6 µC/g |
| 120 min | +2.9 µC/g |

Example 3:

a) Pigment Crude

The preparation takes place as in Example 1 a).

b) Finishing

The preparation takes place as in Example 1 b), but with the addition of 31.1 parts of a 10% by weight aqueous suspension of the pigment dispersant of the formula (III) with m being 1.

Working Up and Milling Take Place as in Example 1.

This gives a highly crystalline powder having an X-ray index of 6.48 and a BET surface area of 99.0 m²/g.

The investigation of the particle size distribution of the primary particles yields the following parameters:

$d_{25}$=31 nm, $d_{50}$=39 nm, $d_{75}$=50 nm.

Length to width ratio: 1.52:1

The transmittance is determined in the same way as in Example 1.

Coloristics:

| L* | a* | b* |
| --- | --- | --- |
| 49.00 | 48.42 | −61.05 |

Transmittance Values of the Color Filter Film:

|  | Wavelength | | | | | | |
| --- | --- | --- | --- | --- | --- | --- | --- |
|  | 400 nm | 410 nm | 420 nm | 430 nm | 440 nm | 450 nm | 460 nm |
| Transmittance (%) | 63.8 | 67.2 | 69.9 | 71.8 | 72.5 | 71.0 | 67.7 |

|  | Wavelength | | | | | |
| --- | --- | --- | --- | --- | --- | --- |
|  | 470 nm | 480 nm | 490 nm | 500 nm | 510 nm | 520 nm |
| Transmittance (%) | 62.0 | 52.5 | 38.5 | 24.8 | 14.6 | 7.6 |

|  | Wavelength | | | | | |
| --- | --- | --- | --- | --- | --- | --- |
|  | 530 nm | 540 nm | 550 nm | 560 nm | 570 nm | 580 nm |
| Transmittance (%) | 4.7 | 4.6 | 5.2 | 5.0 | 6.0 | 10.4 |

-continued

|  | Wavelength | | | | | |
|---|---|---|---|---|---|---|
|  | 590 nm | 600 nm | 610 nm | 620 nm | 630 nm | 640 nm |
| Transmittance (%) | 19.0 | 27.3 | 28.8 | 25.2 | 25.5 | 34.0 |
|  | Wavelength | | | | | |
|  | 650 nm | 660 nm | 670 nm | 680 nm | 690 nm | 700 nm |
| Transmittance (%) | 48.4 | 62.8 | 73.0 | 78.9 | 82.2 | 83.9 |

Determination of Viscosity:
The Viscosity of the Color Filter Paste is As Follows: $\eta=13.7$ mPas.

Determination of particle size distribution:
The color filter paste from Example 3 is subjected to measurement as in Example 1.

| Maximum peak | Value at half peak height | $d_{50}$ |
|---|---|---|
| 62.3 nm | 49.5 nm | 61.7 nm |

Electrostatic Properties (Toner):
A test toner is prepared and subjected to measurement in the same way as in Example 1, incorporating now 5 parts of pigment preparation from Example 3 rather than 5 parts of the pigment preparation from Example 1. As a function of the activation time the following q/m values are measured:

| Activation time | Charge q/m |
|---|---|
| 5 min | +1.1 µC/g |
| 10 min | +1.5 µC/g |
| 30 min | +1.3 µC/g |
| 120 min | +1.8 µC/g |

Example 4:

a) Synthesis of the pigment crude:
A stirred ball mill of the type Drais PML (manufacturer: Draiswerke GmbH, Mannheim) filled with 336 g of zirconium mixed oxide beads of diameter 0.3-0.4 mm as grinding media is charged in succession with 85 g of water and 15 g of coarsely crystalline crude pigment (Pigment Violet 23), which are milled therein for 10 minutes at 30° C. with a peripheral stirrer speed of 15.6 m/s and a specific power density of 3.1 kW per liter of milling space.

Subsequently the millbase suspension is sieved to remove the grinding media, which are rinsed with water, and the combined millbase suspensions are subjected to suction filtration.

b) Finishing
The filter residue is taken up in water to give 150 ml of an aqueous suspension to which 45 g of isobutanol are added. After a subsequent stirring time of 24 h and stirring at boiling temperature for a number of hours, the system is admixed with 7.5 parts of an aqueous suspension of the pigment dispersant (10% by weight), the solvent is removed by distillation, and the residue is diluted with 18.7 parts of water.

Working up and milling take place as in Example 1.
This gives a highly crystalline powder having an X-ray index of 8.92 and a BET surface area of 69.5 m²/g.

The investigation of the particle size distribution of the primary particles yields the following parameters:
$d_{25}=47$ nm, $d_{50}=63$ nm, $d_{75}=94$ nm.
Length to width ratio: 1.80:1
Coloristics:

| L* | a* | b* |
|---|---|---|
| 50.5 | 44.56 | −59.09 |

Transmittance Values of the Color Filter Film:

|  | Wavelength | | | | | | |
|---|---|---|---|---|---|---|---|
|  | 400 nm | 410 nm | 420 nm | 430 nm | 440 nm | 450 nm | 460 nm |
| Transmittance (%) | 63.9 | 67.3 | 70.0 | 72.0 | 72.7 | 71.3 | 68.1 |
|  | Wavelength | | | | | | |
|  | 470 nm | 480 nm | 490 nm | 500 nm | 510 nm | 520 nm | |
| Transmittance (%) | 62.8 | 53.8 | 40.5 | 27.3 | 17.2 | 9.8 | |
|  | Wavelength | | | | | | |
|  | 530 nm | 540 nm | 550 nm | 560 nm | 570 nm | 580 nm | |
| Transmittance (%) | 6.4 | 6.1 | 6.7 | 6.4 | 7.1 | 11.1 | |

-continued

| | Wavelength | | | | | |
|---|---|---|---|---|---|---|
| | 590 nm | 600 nm | 610 nm | 620 nm | 630 nm | 640 nm |
| Transmittance (%) | 19.2 | 27.6 | 29.6 | 25.9 | 25.4 | 32.8 |

| | Wavelength | | | | | |
|---|---|---|---|---|---|---|
| | 650 nm | 660 nm | 670 nm | 680 nm | 690 nm | 700 nm |
| Transmittance (%) | 46.3 | 60.6 | 71.1 | 77.5 | 81.1 | 83.2 |

Determination of the Viscosity:

The viscosity of the color filter paste amounts to η=19.9 mpas.

Determination of Particle Size Distribution:

The color filter paste from Example 4 is subjected to measurement as in Example 1.

| Maximum peak | Value at half peak height | $d_{50}$ |
|---|---|---|
| 69.9 nm | 71.8 nm | 69 nm |

Electrostatic Properties (Toner):

A test toner is prepared and subjected to measurement in the same way as in Example 1, with incorporation now of 5 parts of pigment preparation from Example 4 rather than 5 parts of the pigment preparation from Example 1. As a function of the activation time the following q/m values are measured:

| Activation time | Charge q/m |
|---|---|
| 5 min | +0.7 μC/g |
| 10 min | +0.9 μC/g |
| 30 min | +0.4 μC/g |
| 120 min | +0.6 μC/g |

The invention claimed is:

1. A method of coloring a color filtercomprising the step of adding a colorant to the color filter during the production thereof, wherein the colorant includes a pigment preparation comprising a) a dioxazine compound of the formula (I) as base pigment

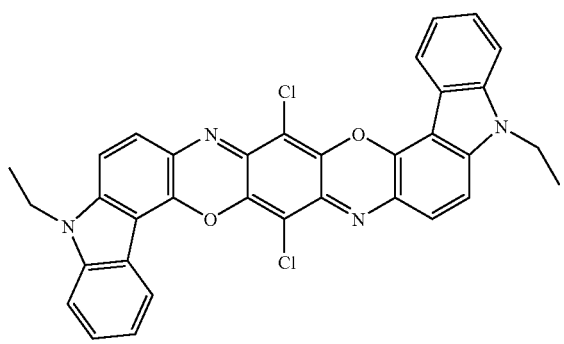

(I)

and b) a dioxazine compound of the formula (II) as pigment dispersant $$Q\text{-}[Y\text{---}X]_m \qquad (II)$$

wherein

Q is an m-valent radical of the base pigment of the formula (I),

Y is a bridging moiety from the series —$(CR^1R^2)_x$— with x being 1 to 6, substituted or unsubstituted phenylene, —CO—, or —$NR^3$—, or a nonrepeating or repeating combination of at least two such bridging members of different type, $R^1$, $R^2$, and $R^3$ independently of one another being hydrogen or $C_1$-$C_4$-alkyl, X is the radical of an aliphatic or aromatic, five-, six- or seven-membered heterocyclic system attached to the bridging member Y via a C atom and has in each case 1 to 3 identical or different ring heteroatoms selected from the group consisting of nitrogen, oxygen and sulfur and, optionally, also has a benzo-fused ring optionally substituted by $C_1$-$C_4$-alkyl, $C_2$-$C_4$-alkenyl, $C_1$-$C_3$-hydroxyalkyl or phenyl;

or is a phthalimido radical attached to the bridging member Y via the imide nitrogen and and is optionally substituted up to a maximum of four times on the benzoid ring by chloro, bromo, nitro, carboxyl, N—($C_1$-$C_5$-alkyl)carbamoyl, N-phenylcarbamoyl or benzoylamino;

or is a radical —$NR^4R^5$, in which $R^4$ and $R^5$ independently of one another are hydrogen, substituted or unsubstituted $C_1$-$C_{20}$-alkyl or $C_2$-$C_{20}$-alkenyl, $C_5$-$C_6$-cycloalkyl, substituted or unsubstituted phenyl, benzyl or naphthyl;

or in which the group —$NR^4R^5$ forms an aliphatic or aromatic, five-, six- or seven-membered heterocyclic system having in 1 to 3 identical or different ring heteroatoms selected from the group consisting of nitrogen, oxygen and sulfur, and, optionally, also has a benzo-fused ring optionally substituted by hydroxyl, oxo, $C_1$-$C_4$-alkyl, $C_2$-$C_4$-alkenyl, $C_1$-$C_3$-hydroxyalkyl or phenyl, and m indicates a numerical value between 1 and 4 wherein the pigment dispersant is a compound of the formula (III)

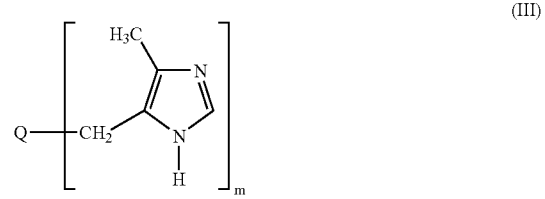

(III)

2. The method as claimed in claim 1, wherein m is a number from 1 to 2.

3. The method as claimed in claim 1, wherein the pigment preparation contains 0.5% to 99% by weight of pigment dispersant of the formula (II), based on the weight of the base pigment of the formula (I).

4. The method as claimed in claim 1, wherein the pigment preparation contains 5% to 30% by weight of pigment dispersant of the formula (II), based on the weight of the base pigment of the formula (I).

5. The method as claimed in claim 1, wherein the pigment preparation is shaded with a colorant selected from the group of organic pigments, inorganic pigments and organic dyes.

6. A color filter colored by the method according to claim 1.

* * * * *